(12) United States Patent
Cadugan

(10) Patent No.: US 11,150,110 B2
(45) Date of Patent: Oct. 19, 2021

(54) SENSOR HAVING A SHAPED COIL

(71) Applicant: Allegro MicroSystems, LLC, Manchester, NH (US)

(72) Inventor: Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 182 days.

(21) Appl. No.: 16/529,125

(22) Filed: Aug. 1, 2019

(65) Prior Publication Data

US 2021/0033424 A1 Feb. 4, 2021

(51) Int. Cl.
*G01D 5/16* (2006.01)
*G01R 33/09* (2006.01)

(52) U.S. Cl.
CPC ............ *G01D 5/16* (2013.01); *G01R 33/091* (2013.01); *G01R 33/093* (2013.01)

(58) Field of Classification Search
CPC ................................ G01D 5/16; G01R 33/091
See application file for complete search history.

(56) References Cited

U.S. PATENT DOCUMENTS

| | | | |
|---|---|---|---|
| 6,211,673 B1 * | 4/2001 | Gerber | G01R 33/0385 324/262 |
| 7,705,586 B2 | 4/2010 | van Zon et al. | |
| 8,907,669 B2 | 12/2014 | Petrie | |
| 9,116,018 B2 * | 8/2015 | Frachon | G01D 5/147 |
| 9,664,494 B2 | 5/2017 | Fernandez et al. | |
| 9,817,078 B2 | 11/2017 | Pepka et al. | |
| 10,145,908 B2 | 12/2018 | David et al. | |
| 10,310,028 B2 | 6/2019 | Latham et al. | |
| 10,324,141 B2 | 6/2019 | Latham et al. | |
| 2015/0022193 A1 * | 1/2015 | Burdette | G01R 33/06 324/239 |
| 2015/0369631 A1 | 12/2015 | Cheung et al. | |
| 2018/0340911 A1 | 11/2018 | Romero | |
| 2018/0340986 A1 | 11/2018 | Latham et al. | |
| 2018/0340987 A1 | 11/2018 | Latham et al. | |

(Continued)

FOREIGN PATENT DOCUMENTS

EP 1 797 496 B1 7/2009

OTHER PUBLICATIONS

Enoki et al., "Electromagnetic Measurement of the Rail Displacement by Two Triangular Coils;" IEEE Transactions on Magnetics, vol. 38, No. 5; Sep. 2002; 3 Pages.

(Continued)

*Primary Examiner* — Reena Aurora
(74) *Attorney, Agent, or Firm* — Daly, Crowley, Mofford & Durkee, LLP

(57) ABSTRACT

Methods and apparatus for sensing target position by generating a signal by energizing a shaped coil with an AC signal. A sensor receives a signal reflected by a target in response to the signal from the shaped coil, wherein the shaped coil has a first width, and wherein the sensor includes a first sensing element aligned with the shaped coil at the first width, wherein a ratio of the first width and a distance from the sensor to the target is about three-to-one. The received signal can be processed to determine position information of the target. In some embodiments, a shaped coil can have a trapezoidal shape and sensors aligned with the coil to select a sensor based upon target to sensor distance.

13 Claims, 9 Drawing Sheets

(56) References Cited

U.S. PATENT DOCUMENTS

| | | |
|---|---|---|
| 2018/0340988 A1 | 11/2018 | Latham et al. |
| 2018/0340989 A1 | 11/2018 | Latham et al. |
| 2019/0250220 A1 | 8/2019 | Latham et al. |
| 2019/0257909 A1 | 8/2019 | Romero et al. |
| 2019/0265018 A1 | 8/2019 | Latham et al. |
| 2019/0312579 A1 | 10/2019 | Romero |

OTHER PUBLICATIONS

George et al., "Advances in Capacitive, Eddy Current, and Magnetic Displacement Sensors and Corresponding Interfaces;" IEEE Transactions on Industrial Electronics, vol. 64, No. 12; Dec. 2017; 13 Pages.
Extended European Search Report dated Dec. 8, 2020 for European Application No. 20187358.5; 9 Pages.
U.S. Appl. No. 16/102,984, filed Aug. 14, 2018, Almiron et al.
U.S. Appl. No. 16/139,558, filed Sep. 24, 2018, Rossi et al.
U.S. Appl. No. 16/295,131, filed Mar. 7, 2019, Cadugan et al.

* cited by examiner

SENSOR HAVING A SHAPED COIL

BACKGROUND

Magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance between the magnetic field sensor and an object. Sensors such as these may be used to detect the proximity of the object as it moves toward and away from the magnetic field sensor. Conventional magnetic field sensors typically include circular or square coils.

SUMMARY

Embodiments of the invention provide methods and apparatus for a magnetic field sensor having a coil shaped to enhance the sensing element response for obtaining increased performance compared with conventional sensors. In embodiments, a sensor includes a coil having a wider end and a narrower end, such as a trapezoidal coil shape, with sensing elements located to align with the coil width. A slope of the signal detected by the magnetic field sensing element, in G/m for example, can be used to determine a distance of a target from the coil. In embodiments, a maximum slope can correspond to a selected distance from coil to target. Relatively small changes in coil-to-target distance can be detected.

In one aspect, a method comprises: generating a signal by energizing a shaped coil with an AC signal; receiving at a sensor a signal reflected by a target in response to the signal from the shaped coil, wherein the shaped coil has a first width, and wherein the sensor includes a first sensing element aligned with the shaped coil at the first width, wherein a ratio of the first width and a distance from the sensor to the target is about three-to-one; and processing the received signal to determine position information of the target.

A method can further include one or more of the following features: the ratio is three-to-one plus/minus ten percent, a peak of a slope of the received signal in G/m corresponds to the first width, the shaped coil and the sensor form part of a sensor IC package, the shaped coil has a trapezoidal shape, the sensor comprises a magnetoresistance element, and/or the magnetoresistance element comprises a GMR element.

In another aspect, a magnetic sensor IC package comprises: shaped coil to generate a signal when the shaped coil is energized with an AC signal; a sensor to receive a signal reflected by a target in response to the signal from the shaped coil, wherein the shaped coil has a first width, and wherein the sensor includes a first sensing element aligned with the shaped coil at the first width, wherein a ratio of the first width and a distance from the sensor to the target is about three-to-one; and a processing module to process the received signal to determine position information of the target.

A magnetic sensor IC package can further includes one or more of the following features: the ratio is three-to-one plus/minus ten percent, a peak of a slope of the received signal in G/m corresponds to the first width, the shaped coil has a trapezoidal shape, the sensor comprises a magnetoresistance element, and/or the magnetoresistance element comprises a GMR element.

In a further aspect, a method comprises: generating a signal by energizing a shaped coil with an AC signal; receiving at a sensor a signal reflected by a target in response to the signal from the shaped coil, wherein the shaped coil has a varying width, and wherein the sensor includes a first sensing element aligned with the shaped coil at a first width and a second sensing element aligned with shaped coil at a second width; and selecting a first one of the first and second sensing elements based upon a ratio of coil width and a distance from the target to the shaped coil.

A method can further include one or more of the following features: the ratio of the selected coil width and a distance from the sensor to the target is about three-to-one, the ratio is three-to-one plus/minus ten percent, a peak of a slope of the received signal in G/m corresponds to a width of the selected first one of the first and second sensing elements, the shaped coil has a trapezoidal shape, the width of the coil changes linearly, and/or the shaped coil and the sensor form part of a sensor IC package.

In a further aspect, a magnetic sensor IC package comprises: a coil to generate a signal by energizing the shaped coil with an AC signal; and a sensor to receive a signal reflected by a target in response to the signal from the shaped coil, wherein the shaped coil has a varying width, and wherein the sensor includes a first sensing element aligned with the shaped coil at a first width and a second sensing element aligned with shaped coil at a second width, wherein a first one of the first and second sensing elements is selectable based upon a ratio of coil width and a distance from the target to the shaped coil.

A magnetic sensor IC package can further include one or more of the following features: the ratio of the selected coil width and a distance from the sensor to the target is about three-to-one, the ratio is three-to-one plus/minus ten percent, a peak of a slope of the received signal in G/m corresponds to a width of the selected first one of the first and second sensing elements, the shaped coil has a trapezoidal shape, and/or the width of the coil changes linearly.

In a further aspect, a magnetic sensor IC package comprises: a coil means for generating a signal by energizing the coil means with an AC signal; and a sensor means for receiving a signal reflected by a target in response to the signal from the coil means, wherein the coil means has a coil varying width, and wherein the sensor means includes a first sensing element aligned with the coil at a first width and a second sensing element aligned with coil at a second width, wherein a first one of the first and second sensing elements is selectable based upon a ratio of coil width and a distance from the target to the coil.

BRIEF DESCRIPTION OF THE DRAWINGS

The foregoing features of this invention, as well as the invention itself, may be more fully understood from the following description of the drawings in which.

DETAILED DESCRIPTION

Figure 1:
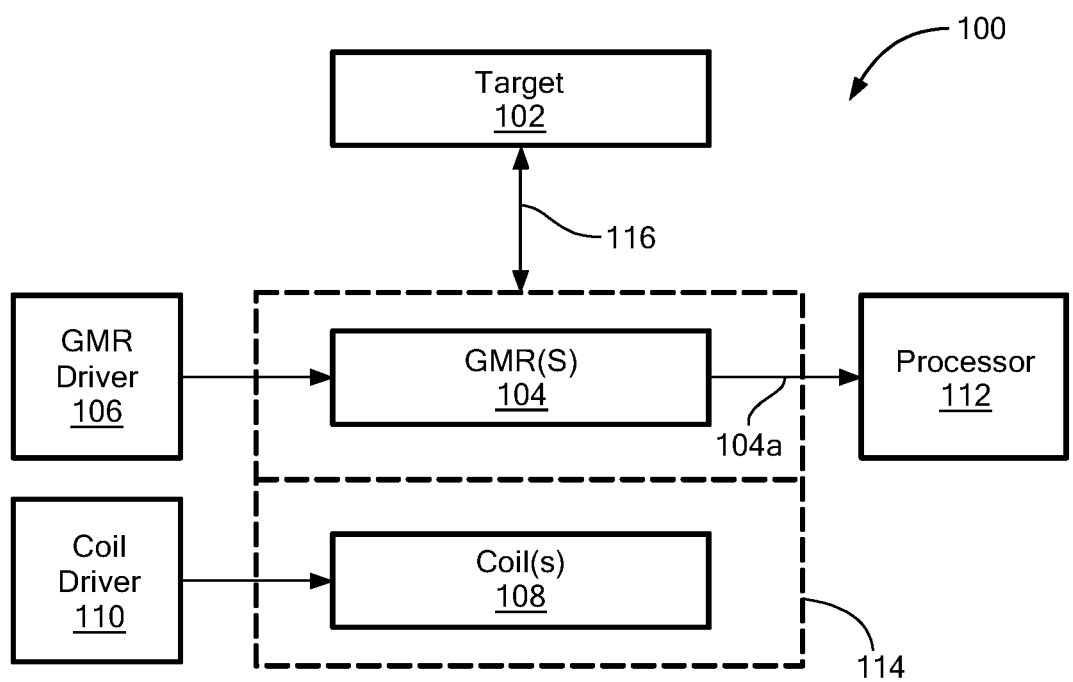
FIG. 1 is a block diagram of a magnetic field sensor with coil actuation.

Before describing example embodiments of the invention some information is provided. FIG. 1 is a block diagram of a system 100 for detecting a conductive target 102. Target 102 may be magnetic or non-magnetic in various embodiments. System 100 includes one or more magnetoresistance (MR) elements 104 and an MR driver circuit 106. MR driver circuit may include a power supply or other circuit that provides power to MR elements 104. In embodiments, MR elements 104 may be replaced with other types of magnetic field sensing elements such as Hall effect elements, etc. MR elements 104 may comprise a single MR element or multiple MR elements. The MR elements may be arranged in a bridge configuration, in certain embodiments. As used herein, the terms "target" and "magnetic target" are used to describe an object to be sensed or detected by a magnetic field sensor or magnetic field sensing element.

System 100 may also include one or more coils 108 and a coil driver circuit 110. Coils 108 may be electrical coils, windings, wires, traces, etc. configured to generate a magnetic field when current flows through the coils 108. In embodiments, coils 108 comprise two or more coils, each a conductive trace supported by substrate, such as a semiconductor substrate, a glass substrate, a ceramic substrate, or the like. In other embodiments, coils 108 may not be supported by a substrate. For example, coils 108 may be supported by a chip package, a frame, a PCB, a ceramic substrate, or any other type of structure that can support traces of a coil. In other embodiments, coils 108 may be free standing wire, i.e. a wire wound coil not supported by a separate supporting structure.

Coil driver 110 comprises a power circuit that supplies current to coils 108 to generate the magnetic field. In an embodiment, coil driver 110 may produce a changing current, such as a pulsed current, a ramped current, an alternating current, or any other shaped current that changes over time so that coils 108 produce changing magnetic fields (i.e. magnetic fields with magnetic moments that change over time). Coil driver 110 may be a circuit implemented, in whole or in part, on the semiconductor die.

System 100 may also include processor 112 coupled to receive signal 104a from MR elements 104, which may represent the magnetic field as detected by MR elements 104. Processor 100 may receive signal 104a and use it to determine a position, speed, direction, or other property of target 102.

MR elements 104 and coils 108 may be positioned on substrate 114. Substrate 114 may comprise semiconductor substrates, such as silicon substrates, a chip package, PCB or other type of board-level substrates, or any type of platform that can support MR elements 104 and coils 108. Substrate 114 may include a single substrate or multiple substrates, as well as a single type of substrate or multiple types of substrates.

In operation, MR driver 106 provides power to MR elements 104 and coil driver 110 provides current to coils 108. In response, coils 108 produce a magnetic field that can be detected by MR elements 104, which produce signal 104a representing the detected magnetic field.

As target 102 moves in relation to the magnetic field, its position and movement through the field changes the field. In response, signal 104a produced by MR elements 104 changes. Processor 112 receives signal 104a and processes the changes in (and/or the state of) the signal to determine position, movement, or other characteristics of target 102. In an embodiment, system 100 can detect movement or position of target 102 along axis 116. In other words, system 100 may detect the position of target 102 in proximity to MR elements 104 as target 102 moves toward or away from MR elements 104 and coils 108. System 102 may also be able to detect other types of position or movement of target 102.

Figure 2A:
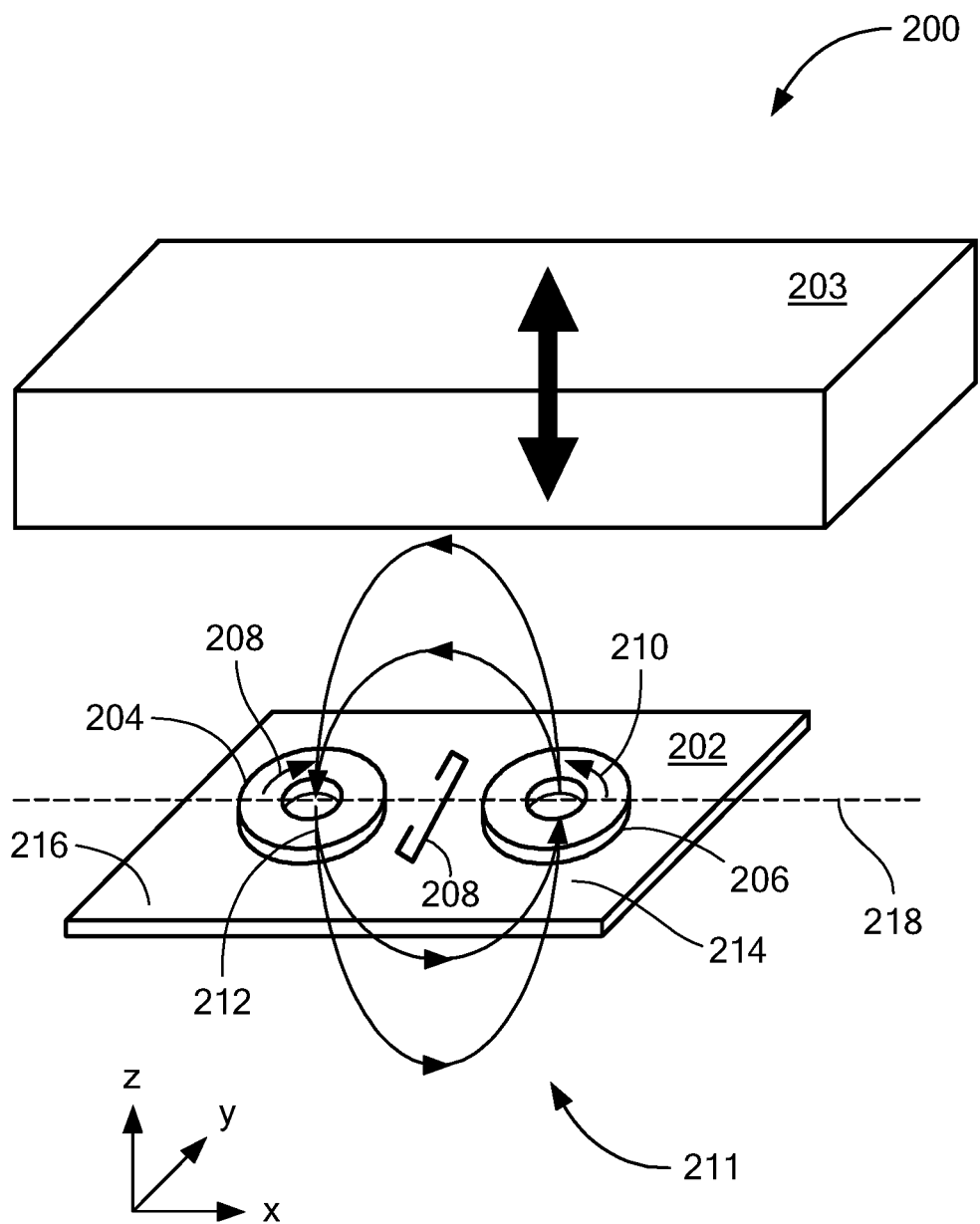
FIG. 2A is a perspective view of a magnetic field sensor with coil actuation.

Referring now to FIG. 2A, system 200 may be the same as or similar to system 100. Substrate 202 may be the same as or similar to substrate 114, and may support coil 204, coil 206, and MR element 208. Although one MR element is shown, MR element 208 may comprise two or more MR elements depending on the embodiment of system 200. Target 203 may be the same as or similar to target 102. Although not shown, an MR driver circuit 106 may provide current to MR element 208 and coil driver circuit 110 may provide current to coils 204 and 206.

Coils 204 and 206 may be arranged so that the current flows through coils 204 and 206 in opposite directions, as shown by arrow 208 (indicating a clockwise current in coil 204) and arrow 210 (indicating a counterclockwise current in coil 206). As a result, coil 204 may produce a magnetic field having a magnetic moment in the negative Z direction (i.e. down, in FIG. 2), as indicated by arrow 212. Similarly, coil 206 may produce a magnetic field having a magnetic moment in the opposite direction, the positive Z direction, as indicated by arrow 214. An aggregate magnetic field 211 produced by both coils may have a shape similar to that shown by magnetic field lines 211. It will be appreciated that coils 204, 206 may be formed by a single coil structure respectively wound so that the current through the coils flows in opposite directions. Alternatively, coils 204, 206 may be formed by separate coil structures.

In an embodiment, MR element 208 may be placed between coils 204 and 206. In this arrangement, absent any other magnetic fields aside from those produced by coils 204 and 206, the net magnetic field at MR element 208 may be zero. For example, the negative Z component of the magnetic field produced by coil 204 may be canceled out by the positive Z component of the magnetic field produced by coil 206, and the negative X component of the magnetic field shown above substrate 202 may be canceled out by the positive X component of the magnetic field shown below substrate 202. In other embodiments, additional coils may be added to substrate 202 and arranged so that the net magnetic field at MR element 208 is substantially nil.

To achieve a substantially zero magnetic field at the location of MR element 208, coil 204 and coil 206 may be placed so that current through the coils flows in circular patterns substantially in the same plane. For example, the current through coil 204 and 206 is flowing in circular patterns through the coils. As shown, those circular patterns are substantially coplanar with each other, and with the top surface 216 of substrate 202.

As noted above, coil driver 110 may produce an alternating field. In this arrangement, the magnetic field shown by magnetic field lines 211 may change direction and magnitude over time. However, during these changes, the magnetic field at the location of MR element 208 may remain substantially nil.

In operation, as target 203 moves toward and away from MR element 208 (i.e. in the positive and negative Z direction), magnetic field 211 will cause eddy currents to flow within target 203. These eddy currents will create their own magnetic fields, which will produce a non-zero magnetic field in the plane of the MR element 208, which non-zero magnetic field can be sensed to detect the motion or position of target 203.

Figure 2B:
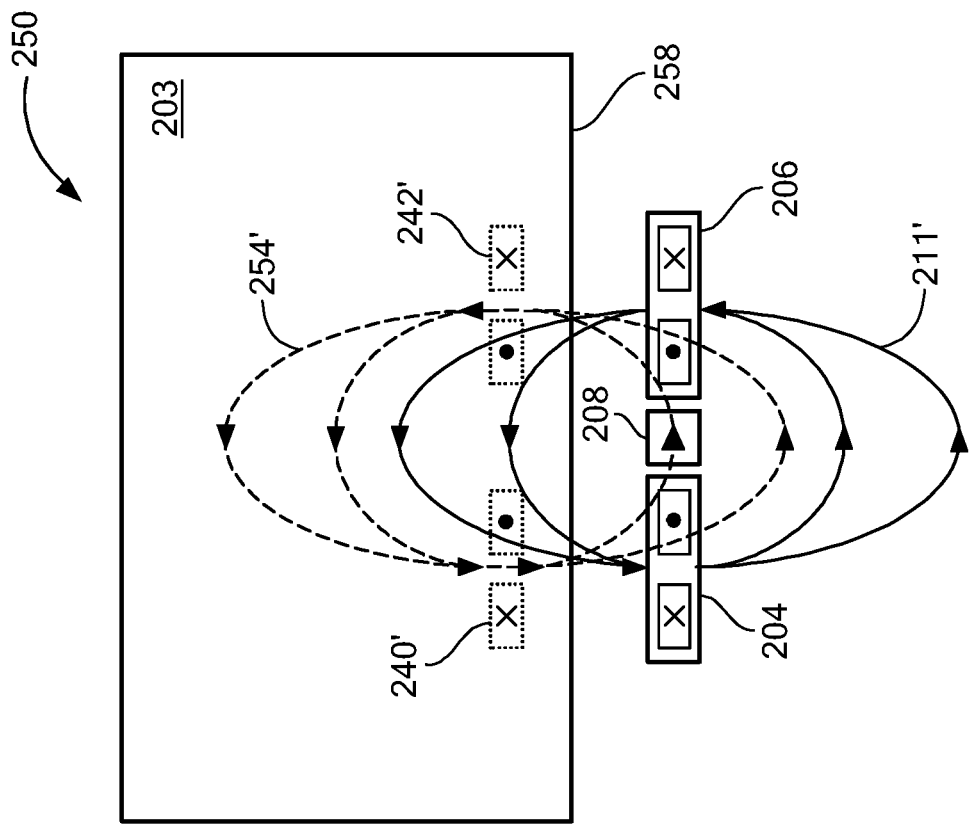
FIG. 2B is a block diagram of a magnetic field sensor with coil actuation detected a reflected field from a target.
Figure 2B:
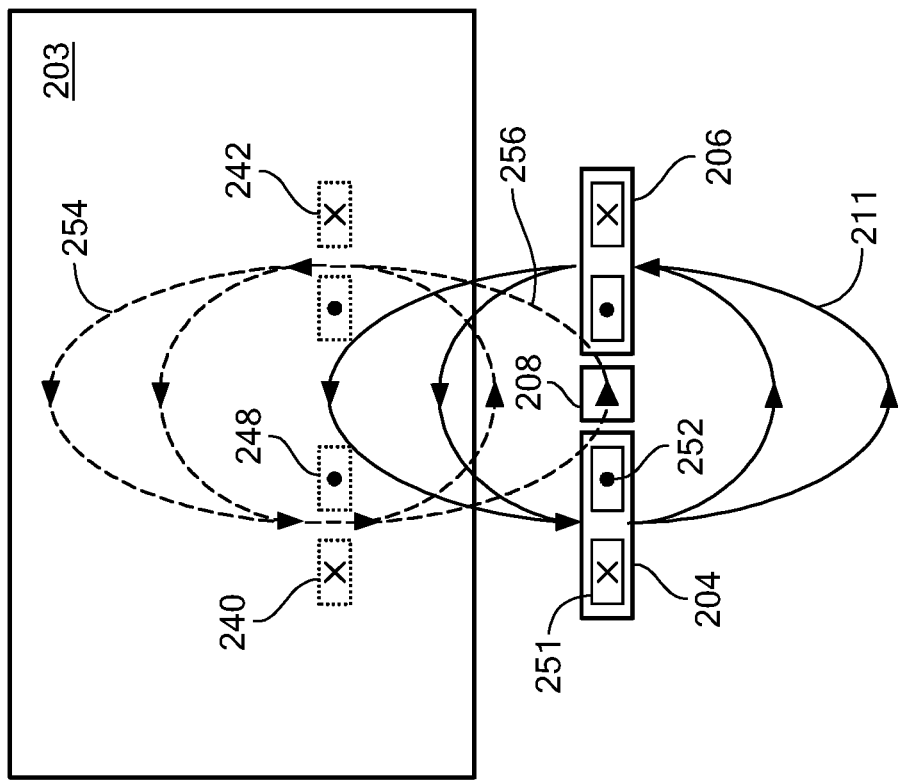

Referring to FIG. 2B, a cross-sectional view 250 of system 200, as viewed at line 218 in the Y direction, illustrates the eddy currents within target 203. The 'x' symbol represents a current flowing into the page and the symbol represents a current flowing out of the page. As noted above, the current through coils 204 and 206 may be an alternating current, which may result in an alternating strength of magnetic field 211. In embodiments, the phase of the alternating current through coil 204 matches the phase of the alternating current through coil 206 so that magnetic field 211 is an alternating or periodic field.

Alternating magnetic field 211 may produce reflected eddy currents 240 and 242 within magnetic or conductive target 203. Eddy currents 240 and 242 may be opposite in direction to the current flowing through coils 204 and 206, respectively. As shown, eddy current 240 flows out of the page and eddy current 248 flows into the page, while coil current 251 flows into the page and current 252 flows out of the page. Also, as shown, the direction of eddy current 242 is opposite the direction of the current through coil 206.

Eddy currents 240 and 242 form a reflected magnetic field 254 that has a direction opposite to magnetic field 211. As noted above, MR element 208 detects a net magnetic field of zero due to magnetic field 211. However, MR element 208 will detect a non-zero magnetic field in the presence of reflected magnetic field 256. As illustrated by magnetic field line 256, the value of reflected magnetic field 254 is non-zero at MR element 208. The reflected magnetic field 254 can be considered as being generated by mirror or phantom coils, which can correspond to eddy currents 240, 248, modeled in relation to the position of the target 203.

As target 203 moves closer to coils 204 and 206, magnetic field 211 may produce stronger eddy currents in target 203. As a result, the strength of magnetic field 254 may change. In FIG. 2B, magnetic field 211' (in the right-hand panel of FIG. 2B) may represent a stronger magnetic field than magnetic field 211 due, for example, to the closer proximity of target 203 to coils 204 and 206. Thus, eddy currents 240' and 242' may be stronger currents than eddy currents 240 and 242, and magnetic field 254' may be stronger than magnetic field 254. This phenomenon may result in MR element 208 detecting a stronger magnetic field (i.e. magnetic field 254') when target 203 is closer to coils 204 and 206, and a weaker magnetic field (i.e. magnetic field 254) when target 203 is further away from coils 204 and 206.

Also, eddy currents 240' and 242' generally occur on or near the surface of target 203. Therefore, as target 203 moves closer to MR element 208, MR element 208 may experience a stronger magnetic field from the eddy currents because the source of the reflected magnetic field is closer to MR element 208. Note that, for ease of illustration, the eddy currents appear in the center of target 203 in the drawing. In an actual device, the eddy currents may occur at or near the surface or "skin" of target 203.

In one aspect of the invention, example embodiments include a coil shaped to enhance sensor performance. In embodiments, the coil is shaped to vary in width. In some embodiments, a coil has a trapezoidal shape with sensing elements aligned with the coil shape. In embodiments, a slope of net flux at a sensing element can be used to enhance sensor performance and/or precision.

Figures 3A, 3B:
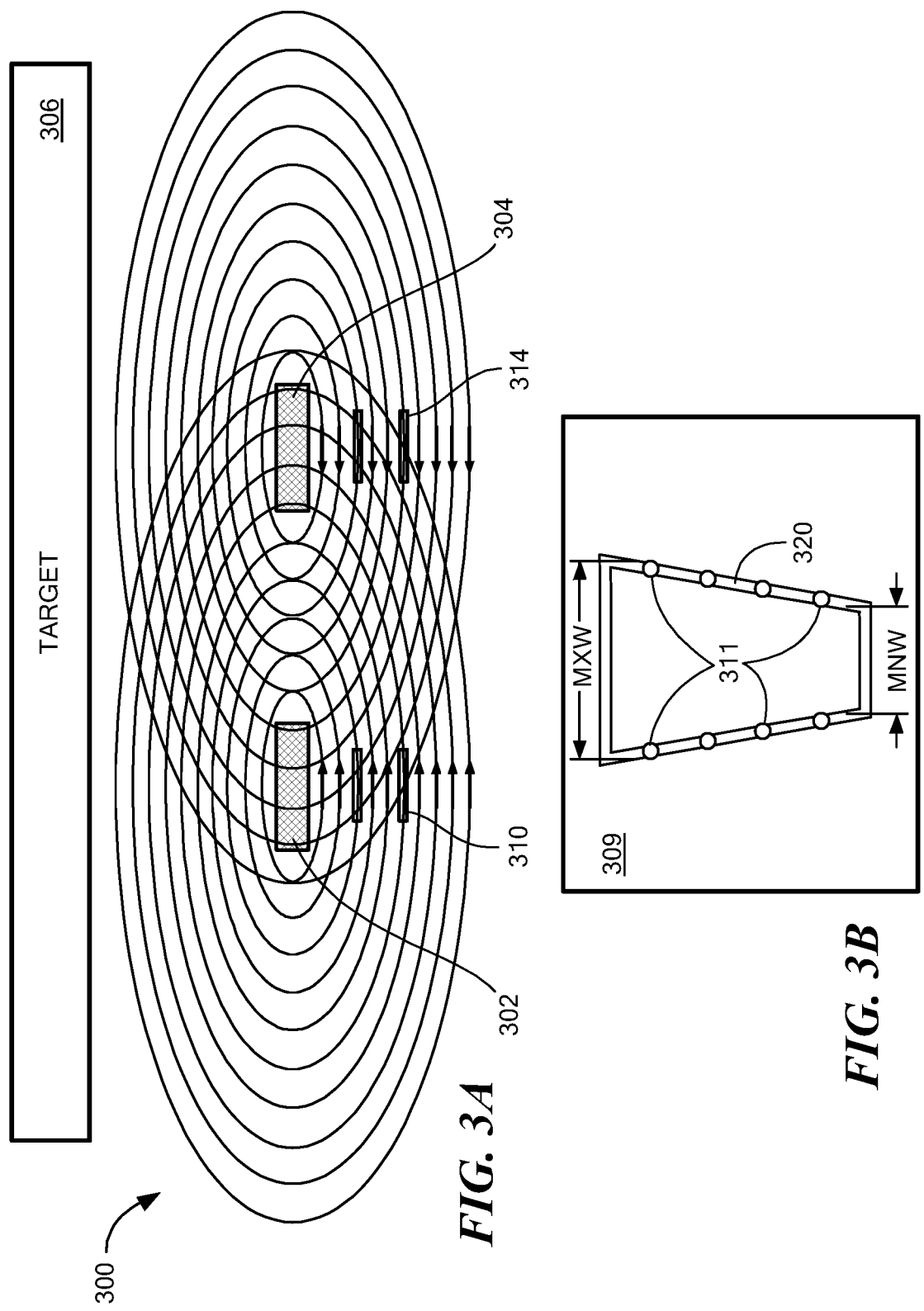
FIG. 3A is a schematic representation of a coil positioned between a target and sensors.
FIG. 3B is a schematic representation of a coil having an example shape in the form of a trapezoid.

FIG. 3A shows an example system 300 having first and second coil portions 302, 304 located in relation to a target 306. The first and second coil portions 302, 304 can be considered eddy currents/mirror coils located in relation to the target 306, as described more fully below. A first sensor element 310 is spaced at a given distance from the target and aligned with the first coil portion 302. A second sensor 314 element is also spaced from the target aligned with the second coil portion 304. It is understood that the distance from sensor elements to the target, which can move, can vary.

In the illustrated embodiment of FIG. 3B, an example sensor IC package 309 including a coil 320 having a trapezoidal shape with a maximum width MXW at one end and a minimum width MNW at the other end. Also shown are locations of sensing elements 311 on the sensors 310, 314 in one embodiment. As can be seen the location of sensing elements 311 is aligned with the varying width of the coil 320.

It is understood that the shape of the coil 320 can be of any practical shape that varies a width of the coil along its length. It is further understood that the locations of sensing elements in the sensors can placed in relation to the shape of the coil(s) to meet the needs of a particular application. Example embodiments can include shapes that have linear and non-linear changes in width.

It should be noted that different widths can be used for different target distances. In some embodiments, a target may move in relation to the coil in 'steps' that can be optimized to meet the needs of a particular application. Also, differences in the coil spacing sensors can show different responses for the same target, such as for adding additional immunity to vibration or other dynamic spacing "noise."

Referring again to FIGS. 3A and 3B, an AC magnetic field generates eddy currents in the target 306 that are reflected and detected by sensing elements 311 on the sensors 310, 314. One can represent the target 306 by assuming that the (mirror) coil is two times the distance from the sensing elements 310 as the target.

As can be seen in FIG. 3A, a given sensor, such as the first sensor 310 sees flux generated from the first coil 302 above it, and also from the second coil 304 on the other side. In embodiments, this flux is generated as flux reflected from the target 306. The flux from the first and second coils 302, 304 tends to cancel each other for the first sensor 310 since the flux is in the opposite direction.

Figure 3C:
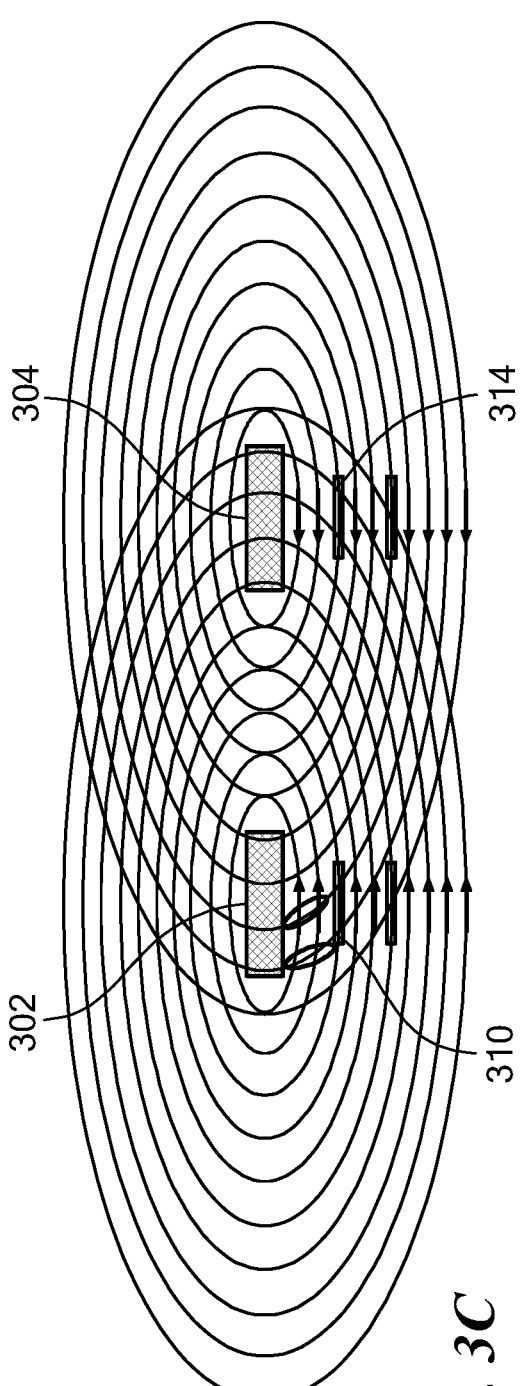
FIG. 3C is a representation emphasizing the orientation of coil flux lines in relation to a first sensor.
Figure 3D:
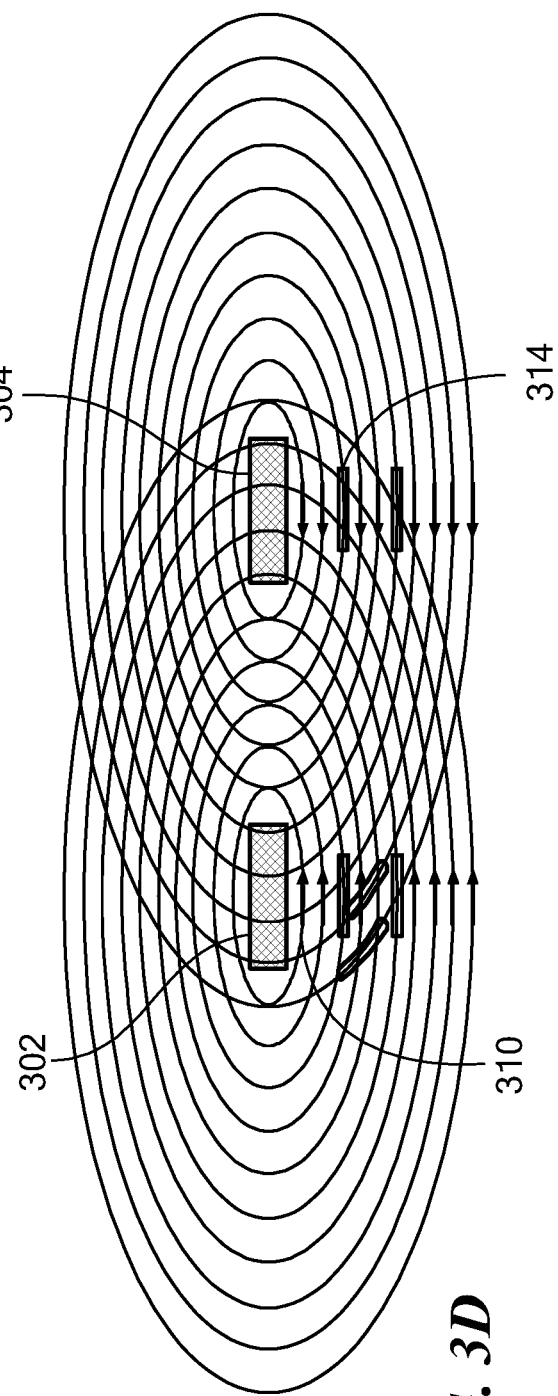
FIG. 3D is a representation emphasizing the orientation of coil flux lines in relation to a second sensor.

At the first sensor 310, the flux from the second coil 304 is somewhat vertical, as can be seen in emphasis in FIG. 3C. For certain sensing elements, such as TMR elements, there is less sensitivity for vertical flux than for horizontal flux. As the sensing elements move further from the target, the flux becomes more in plane (less vertical), and on a relative basis is proportionally more similar to the flux from the coil directly over it. Thus, the flux from the second coil 304 received by a sensor further from the target is less vertical than the flux on the first sensor 310, as can be seen in emphasis in FIG. 3D.

For relatively small air gaps (when measuring small changes in distance from the target, the flux cancellation allows steepening of the slope of the differential response since distance changes the flux directly from above and the cancellation effect from the other side of the coil. In embodiments, a width of the coil can be optimized for a selected airgap. In other embodiments, a coil can be shaped to vary the width, such as a trapezoidal coil that can be used with multiple sensing elements at widths to match the coil width. In embodiments, a small air gap refers to a distance (in the vertical direction) to the coils of about $\frac{1}{3}^{rd}$ as far from the target as the diameter of the coil, as described more fully below. It can be further noted that this is the point where the steepening of the slope (see FIG. 4) from this effect is not yet overcome by the loss of overall flux due to the cancellation effect).

Figure 3E:
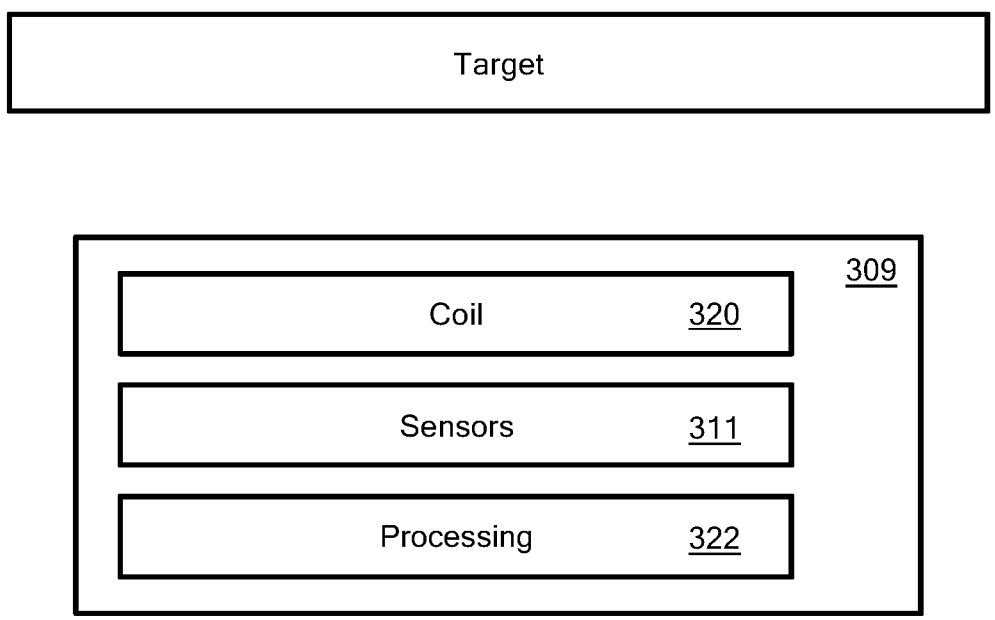
FIG. 3E is a schematic representation of an example integrated circuit package having a shaped coil.

FIG. 3E shows an example sensor IC package 309 that includes a coil 320, which is trapezoidal in example embodiments, sensing elements 311, and a processing module 322, which may be provided as circuitry in an active layer of a semiconductor substrate. In example embodiments, the sensor 311 and the coil 309 are close in vertical distance, e.g., within a few microns. For example, the trapezoidal coil 309 may be located in a plane parallel to the plane of the sensors 311 1-2 um below or above each other. The target 306 may be in the range of several hundred micrometers away. In an example embodiment, the IC package 309 can include the first and second sensors 310, 314 of FIG. 3A. That is, the sensor coil 320 has a 'left' portion of the trapezoid and a 'right' portion of the trapezoidal coil that generate the eddy currents in the mirror coils 302, 204. The sensors 311 in FIG. 3E can include the 'left' sensing elements aligned with the 'left' side of the trapezoidal coil and the 'right' sensing elements aligned with the 'right' side of the coil.

In order to optimize close distance detection, the slope of the net flux at each sensor can be utilized. In other words, if the target is at 300 um vs. 301 um, what is the discernable difference in flux. This flux differential enables measurement of positional differences of the target 306.

Figure 4:
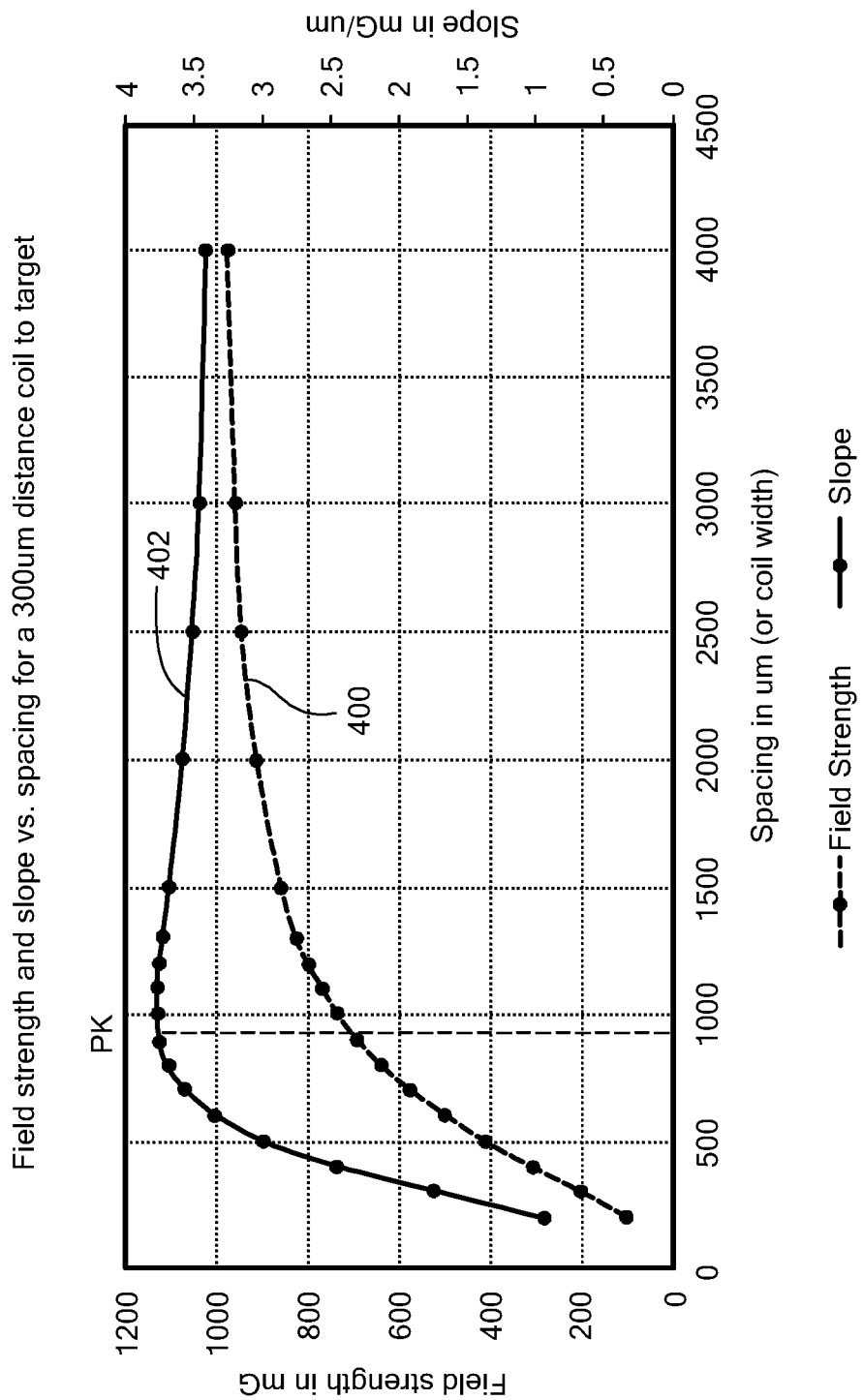
FIG. 4 is a graph of field strength and of slope for a target a given distance from a coil.

FIG. 4 shows an example graph for a coil at 300 mA*Turns (or 30 turns in a coil at 10 mA) what the absolute flux (or field) level 400 is at a sensor and the slope 402 of the flux (or field) versus the distance from the target for that sensor. The field 400 and slope 402 are shown for a 300 μm distance from sensor to target. The slope 402 is shown in mG/μm and the field strength 400 is shown in mG. It can be seen that while the field strength 400 falls off in a predictive manner as the spacing of the coil decreases (due to the cancellation effect), the slope 402 actually is flatter, peaking PK where the coil width is about three times the distance from the target. For the example 300 μm distance from sensor to target, the slope 402 peaks at about 900 μm coil spacing. Narrower coil spacing than this starts to reduce the slope 402 along with the field 400.

In addition to the slope of the field 400 being larger, a smaller coil width allows for a smaller coil with lower resistance, easing the drive capabilities for the coil or allowing for more turns and hence more power.

For the trapezoidal coil 320 of FIG. 3B, sensor locations can be selected to detect the maximum slope 402 (FIG. 402) based on a particular distance to the target. This optimization can yield an increase in signal, such as about ten percent, at the appropriate location on the trapezoidal coil. The slope can correspond to given distance to target. For example, a particular sensing element can be selected based upon a ratio of coil width and a distance from the target to the shaped coil. The ratio of coil width to target distance is about three-to-one. The 3:1 ratio of the selected coil width and a distance from the sensor to the target should be within +/−10 percent where the slope peak is reasonably flat.

Figure 5A:
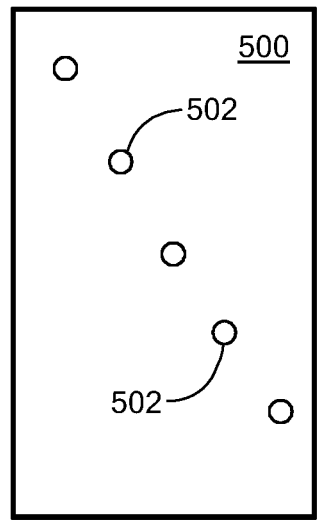
FIG. 5A is a schematic representation showing the location of sensing elements in a sensor for alignment with a shaped coil.
Figure 5B:
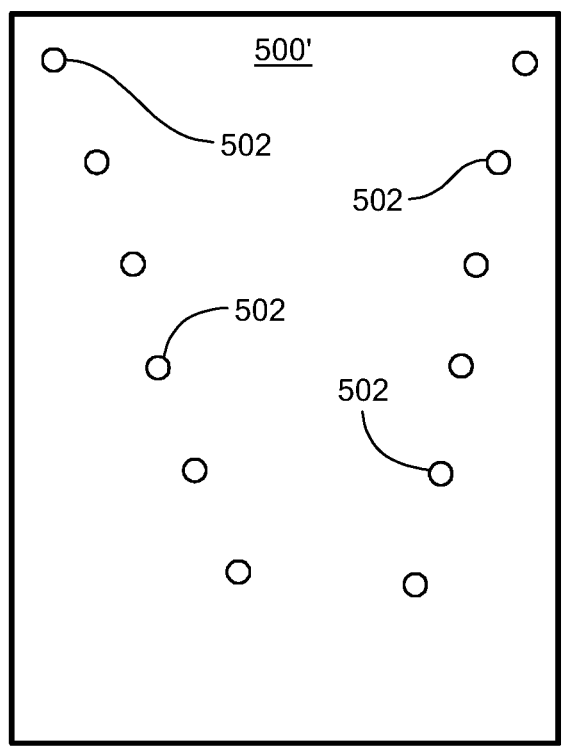
FIG. 5B is a schematic representation showing the location of sensing elements in a further sensor for alignment with a shaped coil.

FIG. 5A shows an example sensor 500 having sensing elements 502 at locations corresponding to different widths of the trapezoidal coil 320. The differing widths for the sensing elements 502 can correspond to widths for the coil spacing 400 in FIG. 4. FIG. 5B shows an example sensor 500' having sensor elements 502 at locations corresponding to left and right portions of a trapezoidal coil.

For example, one can consider that the coil 320 is at 500 um wide at the narrowest width MNW (FIG. 3B) and 1500 um wide at the widest width MW. It is understood that the drawings may not be to scale. Sensing elements 502 can be selected to be roughly 1000 um apart to properly optimize the slope of the magnetic response vs. target distance of FIG. 4.

It is understood that sensors having shaped coils as described are useful in a wide range of applications in which it is desirable to sense movement of a target in relation to a sensor. Examples of sensors that use eddy currents to detect target movement, such as proximity of a deflected substrate, can be found in U.S. patent application Ser. No. 15/606,362 (filed May 26, 2017), which is incorporated here by reference in its entirety. U.S. Pat. No. 10,145,908 (filed Jul. 19, 2013) and U.S. Pat. No. 9,817,078 (filed May 10, 2012) are also incorporated here by reference in their entirety.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 6:
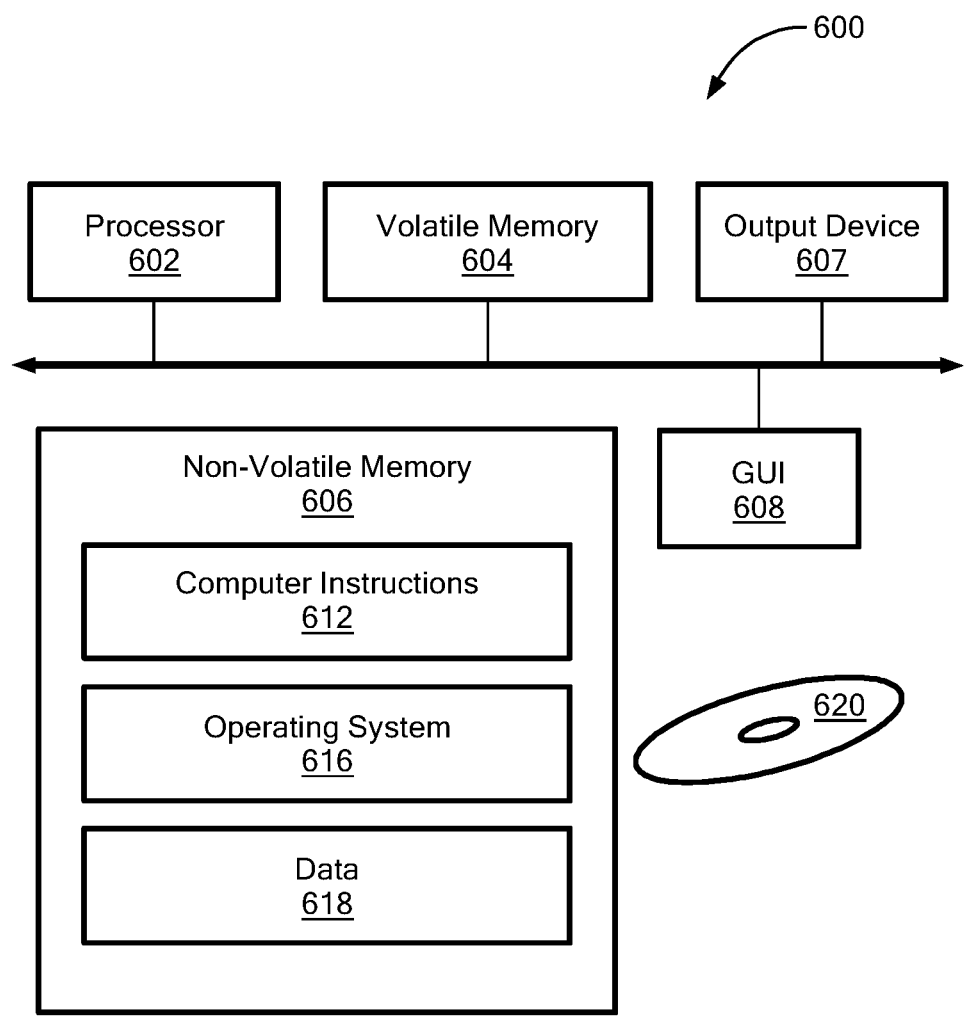
FIG. 6 is an example computer that can perform at least a portion of the processing described herein.

FIG. 6 shows an exemplary computer 600 that can perform at least part of the processing described herein, such as the processing performed by processor 112 in FIG. 1. The computer 600 includes a processor 602, a volatile memory 604, a non-volatile memory 606 (e.g., hard disk), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination.

What is claimed is:

1. A method, comprising:
   generating a signal by energizing a shaped coil with an AC signal;
   receiving at a sensor a signal reflected by a target in response to the signal from the shaped coil, wherein the shaped coil has a varying width, and wherein the sensor includes a first sensing element aligned with the shaped coil at a first width and a second sensing element aligned with shaped coil at a second width; and
   selecting a first one of the first and second sensing elements based upon a ratio of coil width and a distance from the target to the shaped coil,
   wherein a peak of a slope of the received signal in G/m corresponds to a width of the selected first one of the first and second sensing elements.

2. The method according to claim 1, wherein the ratio of the selected coil width and a distance from the sensor to the target is about three-to-one.

3. The method according to claim 2, wherein the ratio is three-to-one plus/minus ten percent.

4. The method according to claim 1, wherein the shaped coil has a trapezoidal shape.

5. The method according to claim 1, wherein the width of the coil changes linearly.

6. The method according to claim 1, wherein the shaped coil and the sensor form part of a sensor IC package.

7. A magnetic sensor IC package, comprising:
   a coil to generate a signal by energizing the shaped coil with an AC signal; and
   a sensor to receive a signal reflected by a target in response to the signal from the shaped coil, wherein the shaped coil has a varying width, and wherein the sensor includes a first sensing element aligned with the shaped coil at a first width and a second sensing element aligned with shaped coil at a second width, wherein a first one of the first and second sensing elements is selectable based upon a ratio of coil width and a distance from the target to the shaped coil.

8. The magnetic sensor IC package according to claim 7, wherein the ratio of the selected coil width and a distance from the sensor to the target is about three-to-one.

9. The magnetic sensor IC package according to claim 8, wherein the ratio is three-to-one plus/minus ten percent.

10. The magnetic sensor IC package according to claim 7, wherein a peak of a slope of the received signal in G/m corresponds to a width of the selected first one of the first and second sensing elements.

11. The magnetic sensor IC package according to claim 7, wherein the shaped coil has a trapezoidal shape.

12. The magnetic sensor IC package according to claim 7, wherein the width of the coil changes linearly.

13. A magnetic sensor IC package, comprising:
   a coil means for generating a signal by energizing the coil means with an AC signal; and a sensor means for receiving a signal reflected by a target in response to the signal from the coil means, wherein the coil means has a coil varying width, and wherein the sensor means includes a first sensing element aligned with the coil at a first width and a second sensing element aligned with coil at a second width, wherein a first one of the first and second sensing elements is selectable based upon a ratio of coil width and a distance from the target to the coil.

\* \* \* \* \*

UNITED STATES PATENT AND TRADEMARK OFFICE
CERTIFICATE OF CORRECTION

PATENT NO. : 11,150,110 B2
APPLICATION NO. : 16/529125
DATED : October 19, 2021
INVENTOR(S) : Bryan Cadugan It is certified that error appears in the above-identified patent and that said Letters Patent is hereby corrected as shown below:

In the Specification

Column 1, Line 64 delete "includes" and replace with --include--.

Column 2, Line 65 delete "detected a" and replace with --detected by a--.

Column 3, Lines 9-10 delete "target a" and replace with --target with a--.

Column 3, Line 29 delete "circuit may" and replace with --circuit 106 may--.

Column 4, Line 9 delete "driver 106" and replace with --driver circuit 106--.

Column 5, Line 2 delete "coil" and replace with --coils--.

Column 6, Line 36 delete "can placed" and replace with --can be placed--.

Column 7, Line 19 delete "effect)." and replace with --effect.--.

Column 7, Line 63 delete "(FIG. 402)" and replace with --(FIG. 4)--.

Column 8, Line 11 delete "spacing 400" and replace with --spacing field strength 400--.

Signed and Sealed this
Thirty-first Day of January, 2023

Katherine Kelly Vidal
*Director of the United States Patent and Trademark Office*